US010021801B2

(12) United States Patent
Deros

(10) Patent No.: US 10,021,801 B2
(45) Date of Patent: Jul. 10, 2018

(54) MODULAR ELECTRONICS SYSTEM WITH INTERFACING INTERCHANGEABLE COMPONENTS

(71) Applicant: Yani Deros, Phoenix, AZ (US)

(72) Inventor: Yani Deros, Phoenix, AZ (US)

(73) Assignee: ATOM, Inc., Scottsdale, AZ (US)

( * ) Notice: Subject to any disclaimer, the term of this patent is extended or adjusted under 35 U.S.C. 154(b) by 0 days.

(21) Appl. No.: 15/586,191

(22) Filed: May 3, 2017

(65) Prior Publication Data

US 2017/0238436 A1    Aug. 17, 2017

Related U.S. Application Data

(63) Continuation of application No. 14/622,850, filed on Feb. 14, 2015.

(60) Provisional application No. 61/940,160, filed on Feb. 14, 2014.

(51) Int. Cl.
| | |
|---|---|
| *H02J 3/00* | (2006.01) |
| *H05K 7/02* | (2006.01) |
| *H01R 13/631* | (2006.01) |
| *H01R 13/62* | (2006.01) |
| *H01R 13/66* | (2006.01) |
| *H01R 27/00* | (2006.01) |
| *H05K 7/10* | (2006.01) |
| *H02M 7/04* | (2006.01) |
| *H02M 7/00* | (2006.01) |
| *F21V 33/00* | (2006.01) |
| *H04W 84/12* | (2009.01) |

(52) U.S. Cl.
CPC ......... *H05K 7/023* (2013.01); *F21V 33/0048* (2013.01); *H01R 13/6205* (2013.01); *H01R 13/6315* (2013.01); *H01R 13/6675* (2013.01); *H01R 27/00* (2013.01); *H02M 7/003* (2013.01); *H02M 7/04* (2013.01); *H05K 7/1076* (2013.01); *H04W 84/12* (2013.01)

(58) Field of Classification Search
USPC .......................................................... 307/11
See application file for complete search history.

(56) References Cited

U.S. PATENT DOCUMENTS

| | | | |
|---|---|---|---|
| 6,121,695 A | 9/2000 | Loh | |
| 6,447,357 B1 | 11/2002 | Cook | |
| 2002/0089820 A1 | 7/2002 | Abboud | |
| 2003/0007321 A1* | 1/2003 | Dayley | ................... G06F 1/181 |
| | | | 361/679.6 |
| 2007/0072474 A1* | 3/2007 | Beasley | ................ H02J 7/0042 |
| | | | 439/332 |
| 2007/0079042 A1 | 4/2007 | Crosswy et al. | |

* cited by examiner

*Primary Examiner* — Rexford Barnie
*Assistant Examiner* — Dru Parries
(74) *Attorney, Agent, or Firm* — Jennings Strouss & Salmon PLC; Michael K. Kelly; Daniel R. Pote

(57) ABSTRACT

Modular system of interfacing consumer electronics devices. The system includes a powered base hub and additional modular components with interface couplers providing electrical continuity between modules. Data transmission between modules may be through the interface couplers or wireless. The system includes a power cord for providing power to the base or wireless pad, but it need not include any additional power or data cords or cables.

17 Claims, 6 Drawing Sheets

MODULAR ELECTRONICS SYSTEM WITH INTERFACING INTERCHANGEABLE COMPONENTS

CROSS REFERENCE TO RELATED APPLICATION

This continuation application claims priority to application Ser. No. 14/622,850 filed Feb. 14, 2015, (Publication No. 2016/0242232), which is a continuation in part of U.S. provisional patent application Ser. No. 61/940,160 of Yani Deros, filed on Feb. 14, 2014, and entitled "Modular Electronics System," which is incorporated herein by reference in its entirety.

FIELD OF THE INVENTION

The present invention relates generally to a modular consumer electronics system, and more particularly to a modular consumer electronics system having interfacing, interchangeable electronic components.

BACKGROUND

Electronic devices used by consumers, such as desktop computers, laptop computers, tablets, smart phones, and various accessories, currently occupy a large market. By 2014, 3 billion Bluetooth®-enabled devices had been shipped, and the average household in the United States had 5 internet-connected devices and 24 electronic products. In 2013, United States Households were estimated to have more than 2.8 billion electronic devices. In addition to computers, typical computer peripheral devices such as printers, external hard drives, mice, etc., there is an increasing number of other electronic devices that can interface with computers, such as smart phones, speakers, televisions, cameras, surveillance equipment, smoke detectors, thermostats, lighting control systems, and appliances.

Many of these devices require at least one power or data cable for operation and/or for charging batteries to enable cordless use. Particularly if the devices are used in conjunction with other devices, such as a computer used with a printer, an external hard drive, a keyboard, a monitor, etc., the proliferation of power and data cables can result in cluttered desks with fields of messy, tangled accumulations of wires. Devices and methods for managing such cable accumulations have been used, but they do not completely eliminate the problem of proliferating cables. In addition, when users purchase electronic peripherals, the designs, shapes, and finishes are dissimilar, resulting in a mismatch of products on their desks and workspaces.

For example, FIG. 1 shows a user and a desktop with a laptop computer 10, a keyboard 12, a monitor 14, an external hard drive 16, speakers 18 and 20, a fan 22, and a lamp 24, along with a large number of data and power cables 26. Mouse 28 is shown in FIG. 2. Even if portable devices, such as laptop computer 10 are used, it is time-consuming to power down the system and then unplug and pack the computer 10 and selected peripheral devices, as shown in FIG. 2. It then is time-consuming to set up and reconnect the devices with the multiple cords.

Thus, there is a need for a system of electronic devices with a variety of components and accessories that eliminates or reduces the clutter currently found when multiple devices are used There is a further need for a system of electronic devices with a variety of components and accessories that can be conveniently and quickly set up and easily disassembled.

There is an additional need for a system which facilitates communication with a wide variety of electronic devices.

BRIEF SUMMARY

To achieve the foregoing and other objects and in accordance with the purpose of the present invention broadly described herein, embodiments of this invention comprise a modular electronics system. The system comprises a base adapted for electrical communication with a high voltage power source, with the base having a first mating surface with a first interface coupler. The system also comprises at least one module stackable with the base and having a second mating surface which is matable with the first mating surface and a second interface coupler matable with the first interface coupler. The module is adapted for wirelessly receiving communications from the base, the communications selected from high voltage power, low voltage DC power, and combinations thereof. The base is adapted for providing high voltage electrical communication, and low voltage DC electrical communication with the at least one module.

In the system, the first and second interface couplers may be matable with each other to transfer signals selected from high voltage power, low voltage power, and combinations thereof, between the base and the module when the first and second mating surfaces are in contact with each other. The first and second interface couplers may be adapted for providing wireless high voltage electrical and wireless low voltage DC electrical connections. The module may be selected from electronic device docks, electronic card readers, hard drives, lamps, batteries, speakers, clocks, electronic device controllers, and combinations thereof. Each module may be operable when positioned as a last module in a series of stacked modules, the series originating with the base. The system may comprise a plurality of modules, wherein each module has a first mating surface with a first interface coupler and a second mating surface with a second interface coupler, with the modules configurable in any order with the first interface coupler of one module coupled with the second interface coupler of an adjacent module, and with modules selected from electronic card readers, hard drives, lamps, batteries, speakers, clocks, and combinations thereof. At least one of the modules may be selected from fans, pencil sharpeners, cup holders, pencil holders, staplers, mug warmers, stock tickers, displays, personal computers, electric staplers, tape dispensers, pencil holders, game controllers, wireless chargers, post-it note dispensers, credit/debit card swipers, web cameras, wireless receivers, wireless transmitters, Blueray/CVD/CD/disk drives, baby monitors, air fresheners, mobile device stands, air ionizers, power interfaces, laptop docking stations, home controls, thermostats, fire alarm/smoke/CO detectors, gestural interfaces, numeric/calculator pads, scanners, eye tracking devices, and combinations thereof. The base may be integral with a support, with the support comprising a power source that is adapted for providing high voltage power wirelessly to the base. The base and each module may be stackable in a configuration selected from horizontal and vertical. The base and each module may comprise matable features selected from keyed protrusions and depressions; magnets; and combinations thereof. The base may further comprise a router capable of providing wifi communication with the at least one module.

Other embodiments of the invention comprise a base for a modular electronics system. The base comprises a high voltage power input; an interface coupler adapted for wirelessly transmitting high voltage power and low voltage data signals; and a router for transmitting and receiving wifi signals.

The base may further comprise a support adapted for wireless high voltage power transmission to the base. The base may be integrated with the support. The base may be combinable with at least one module that is stackable with the base in a configuration selected from horizontal and vertical. The base may comprise at least one feature selected from protrusions, depressions, magnets, and combinations thereof, with the feature adapted for aligning and securing in place the at least one module.

BRIEF DESCRIPTION OF THE DRAWING FIGURES

These and other features, aspects, and advantages of the present invention will become better understood with reference to the following description, appended claims, and accompanying drawings, where:

DETAILED DESCRIPTION OF PREFERRED EXEMPLARY EMBODIMENTS

The present invention comprises a modular system with user-selectable electronic devices that can be combined with a powered base hub in multiple orders or configurations without requiring multiple power cords and data cables. The system of the invention can be used to consolidate electronic devices, decrease space taken up by such devices, create a uniformity and continuity in appearance, anti/or eliminate clutter due to multiple cables interconnecting the devices. The system also provides energy and data storage for component devices and may additionally provide other functions, such as illumination, personal comfort, and facility controls. The system is useful in several types of applications, including entertainment, productivity, control, and monitoring. It provides a central hub suitable for use in many types of environments, such as homes, offices, college dormitories, business facilities, travel, and hotels. The central hub may be linked to appliances, automobiles, lighting devices and systems, cameras, homes, household appliances, pets, controllers therefor, and other objects, and it can be used to interface with systems in ban social media, and businesses. Multi-component embodiments of the system may be less expensive than the cost of combinations of the same types of conventional disassociated components sold separately.

Figure 1:
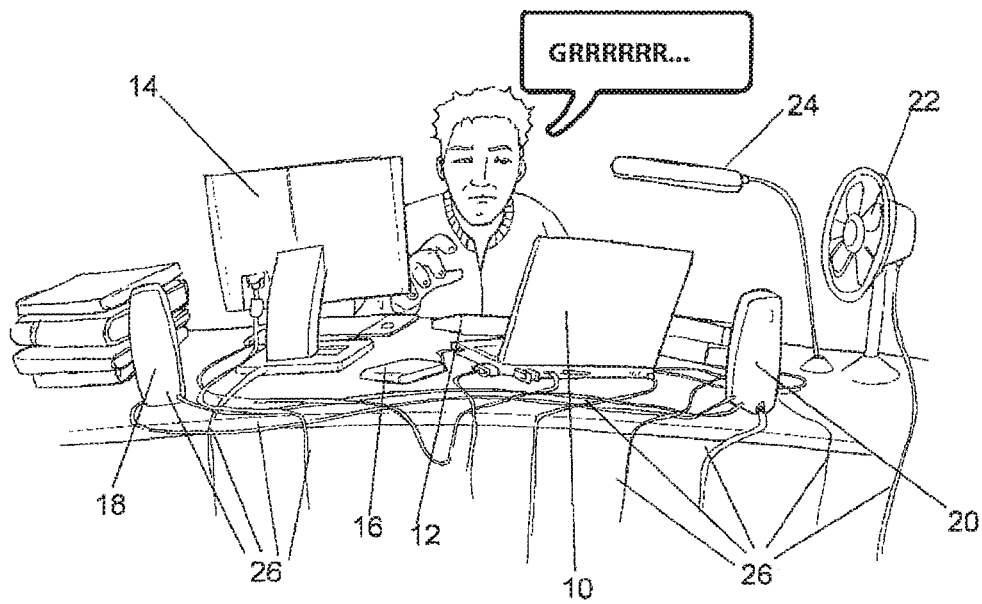
FIG. 1 is an illustration showing a current use scenario of a user and a desktop with a variety of mismatched prior art peripheral electronic devices and ensuing clutter.
Figure 2:
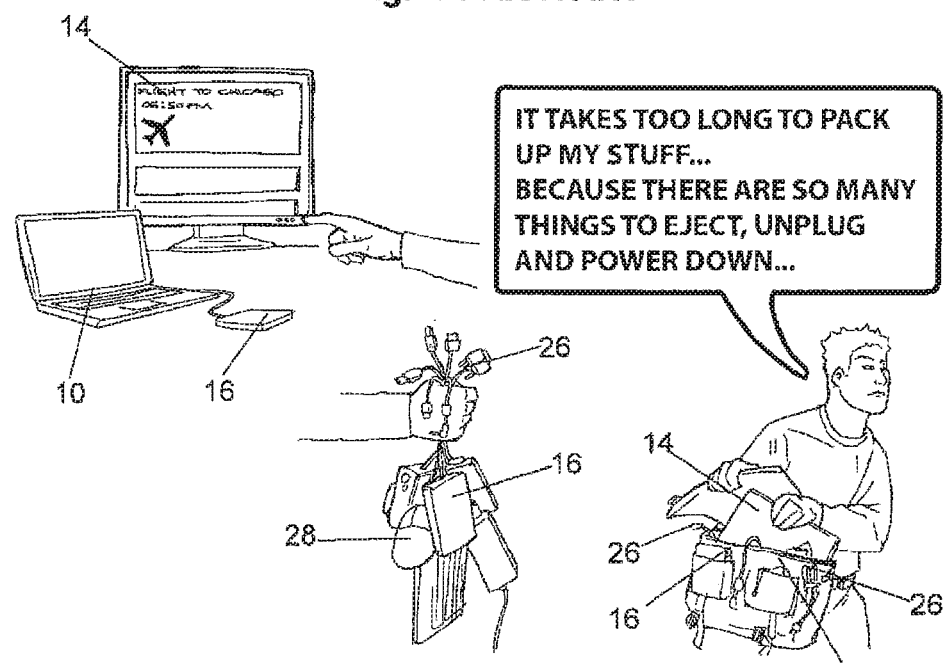
FIG. 2 is a schematic illustration showing the user packing selected prior art peripheral electronic devices to travel to a meeting, event, or trip.
Figure 3:
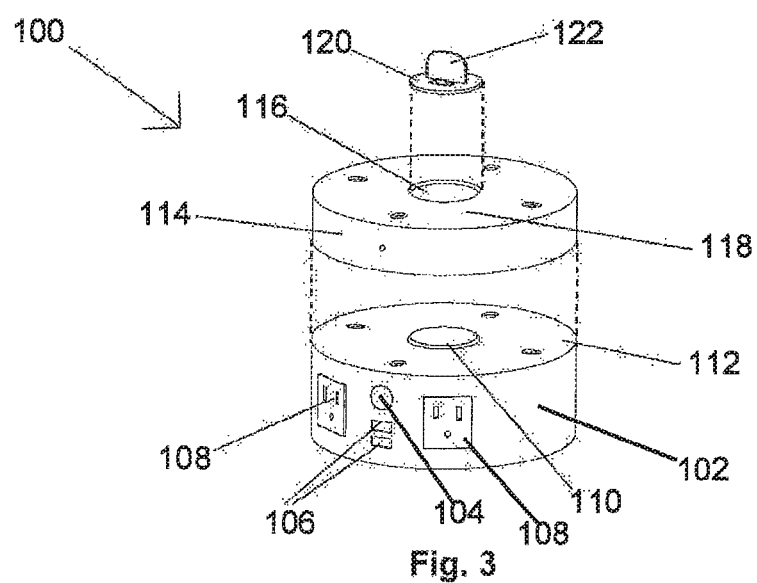
FIG. 3 is an expanded assembly of stackable components of one embodiment of a modular system of devices.
Figure 4:
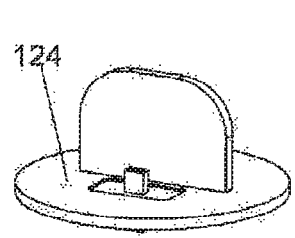
FIG. 4 is a front perspective view of one embodiment of a mobile device cradle in accordance with the present invention.
Figure 5:
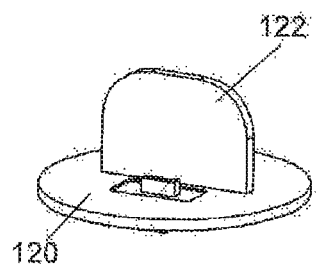
FIG. 5 is a front perspective view of another embodiment of a mobile device cradle in accordance with the present invention.
Figure 6:
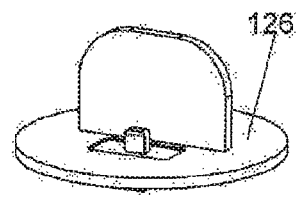
FIG. 6 is a front perspective view of is a front perspective view of yet another embodiment of a mobile device cradle in accordance with the present invention.

As shown in FIG. 3, the system 100 may comprise a powered base huh 102 having a power switch 104, charging USB ports 106, and one or more power outputs 108 for connection to an AC power source, such as with a power cord connected to a receptacle. In addition to providing AC power, the powered base hub 102 includes an AC/DC converter to power other low voltage system modules and a router for handling wifi transmissions. An interface coupler 110 is mounted to a mating surface 112. Device 114 has an opposing mating surface that includes a mating interface coupler (not shown) that is engageable with opposing interface 112 of powered base hub 102. An additional interface coupler 116 is integrated into a secondary surface 118. Mobile cradle 120 also has an interface surface (not shown) adapted for data and electrical connection with an interface coupler, such as coupler 110 or 116. Mobile interface cradle 120 includes a coupling interface 122 for mobile devices, such as a smart phone, tablet, phablet, or other portable device. Cradle 120 may be interchangeable with other interface cradles, such as cradle 124 in FIG. 4 and cradle 126 in FIG. 6, for use with different model mobile or portable communication devices.

Figure 7:
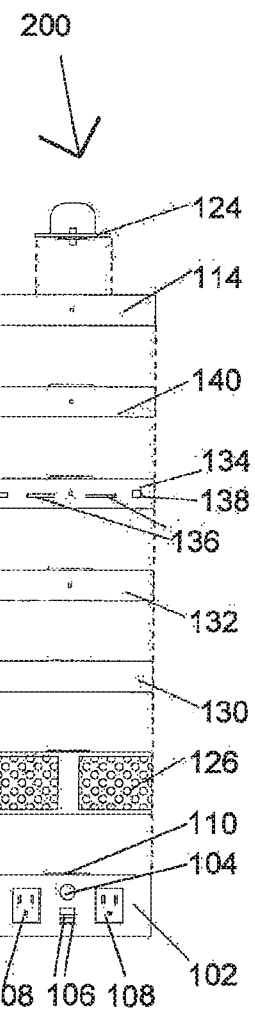
FIG. 7 is a front exploded view of stacked modules in accordance with the present invention.
Figure 8:
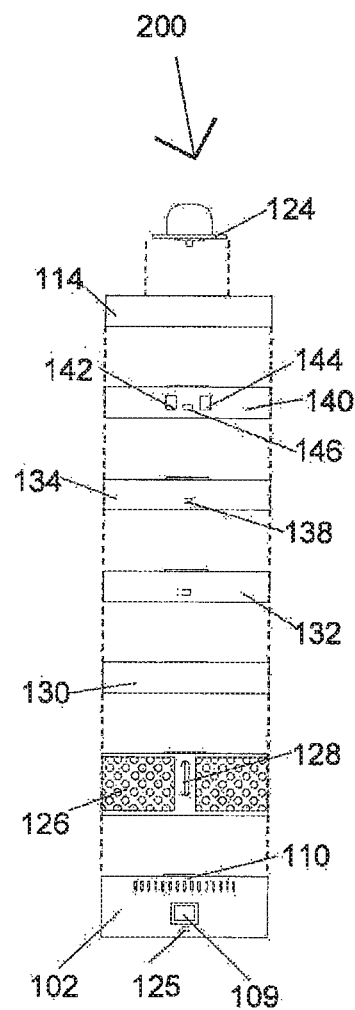
FIG. 8 is a rear exploded view of the stacked modules of FIG. 7.
Figure 9:
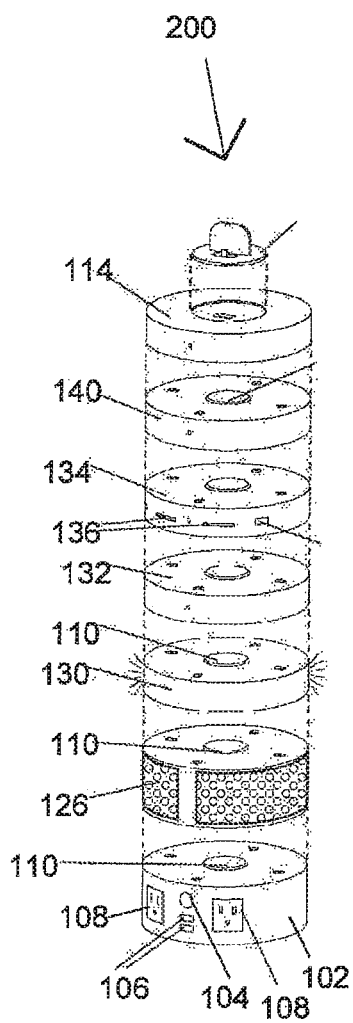
FIG. 9 is a front perspective exploded view of the stacked modules of FIG. 7.
Figure 10:
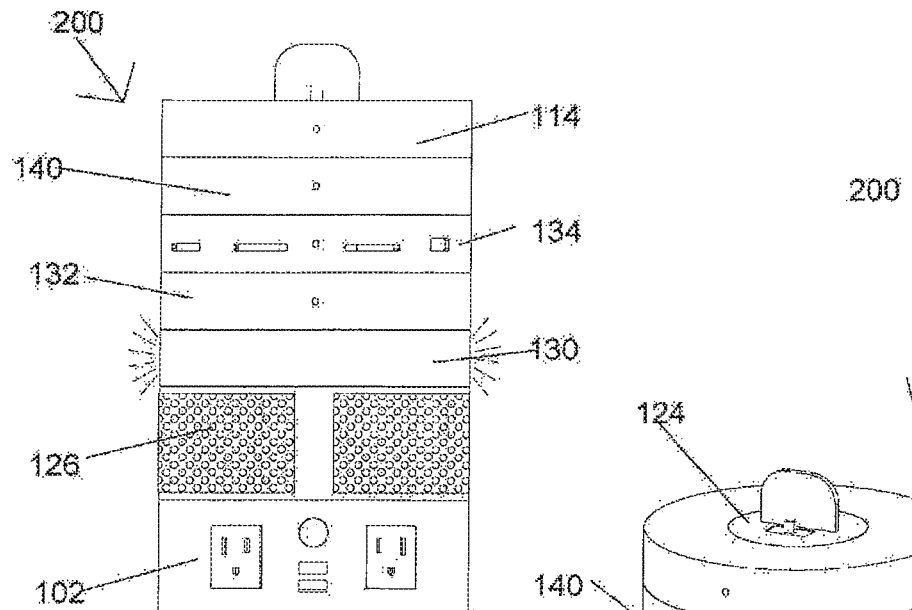
FIG. 10 is a front view of stacked modules of FIG. 7.
Figure 12:
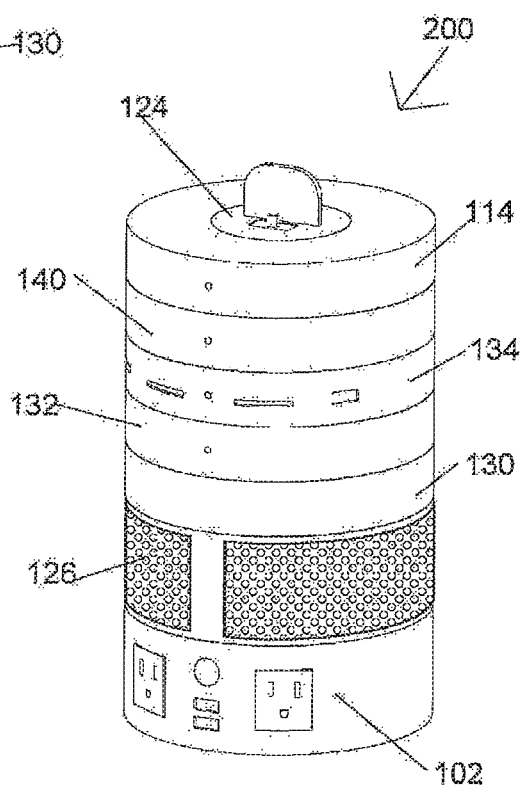
FIG. 12 is a front perspective view of the stacked modules of FIG. 7.
Figure 11:
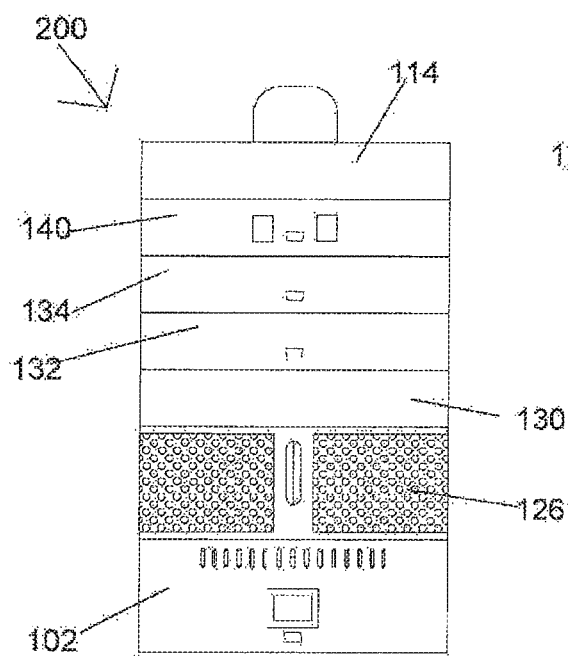
FIG. 11 is a rear view of the stacked modules of FIG. 7.

FIGS. 7, 8, and 9 are front, rear, and front perspective, respectively, expanded views of another assembly 200 of component modules in accordance with the present invention. Powered base hub 102 provides an AC/DC converter with charging usb ports 106 in its front. Power input 109, for use with a cord connected to an AC power source, and data output ports 125 are shown in its rear. A speaker 126 has an auxiliary port 128 in its rear. Light module 130 illuminates circumferentially an area around assembly 200. Solid state drive 132 is for data storage. Data input/output device 134 includes a memory card reader or readers having slots 136 for memory cards and data ports 138. Modular external battery 140 has ports 142 and 144 for incoming and outgoing DC lines (not shown) and another USB port 146. Device mobile dock 114 accommodates a device cradle, such as cradle 124. FIGS. 10, 11, and 12 show the assembled, stacked modules in front, rear, and perspective views, respectively.

As shown, each of modules 102, 130, 132, 134, and 140 has an interface surface with an interface coupler 108 and having the ability to interface with an opposing interface coupler on an adjacent modular device. Each of modules 126, 130, 132, 134, 140, and 114 has a complementary interface coupling on an opposing interface surface. Alternative combinations of interface couplers could be used or integrated with the modules. These features keep the modules connected and aligned when interfaced with each other. The modules 126, 130, 132, 134, and 140 can be stacked in any order between base 102 and mobile device dock 114.

Only one cable is required for this system, a power cord providing power from an AC source, such as a wall outlet, to power input port 109, or the powered base could be hard wired into a building's power lines. Alternatively, a wireless pad may be used to deliver power wirelessly to the system. The interface couplers provide electrical continuity between adjacent modules. Optionally, additional electronic devices may be connected to modules through a singular or series of cable ports provided in several of the modules or the auxiliary port 128 in speaker 126.

Figure 13:
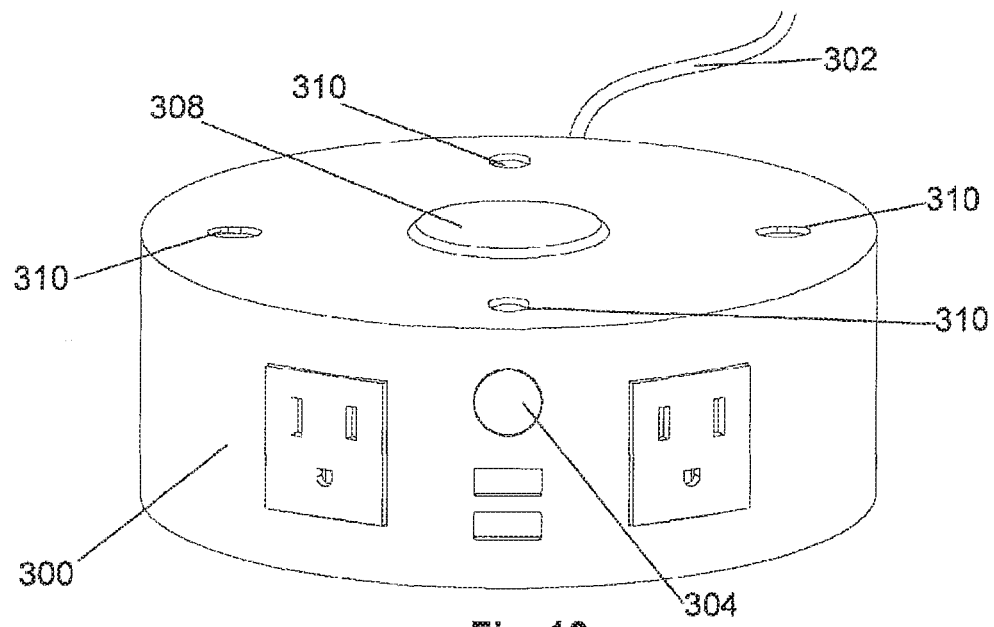
FIG. 13 is a front perspective view of another embodiment of a powered base hub in accordance with the present invention.

Another embodiment of a powered base hub 300 is shown in FIG. 13. Base 300 includes a power cord 302, a power switch 304, an interface coupler 308, and depressions 310 on the upper surface of base 300 that are mateable with shaped protrusions aligning on an opposing plane from an adjacent module (not shown) that may be placed against base 300.

Figure 14:
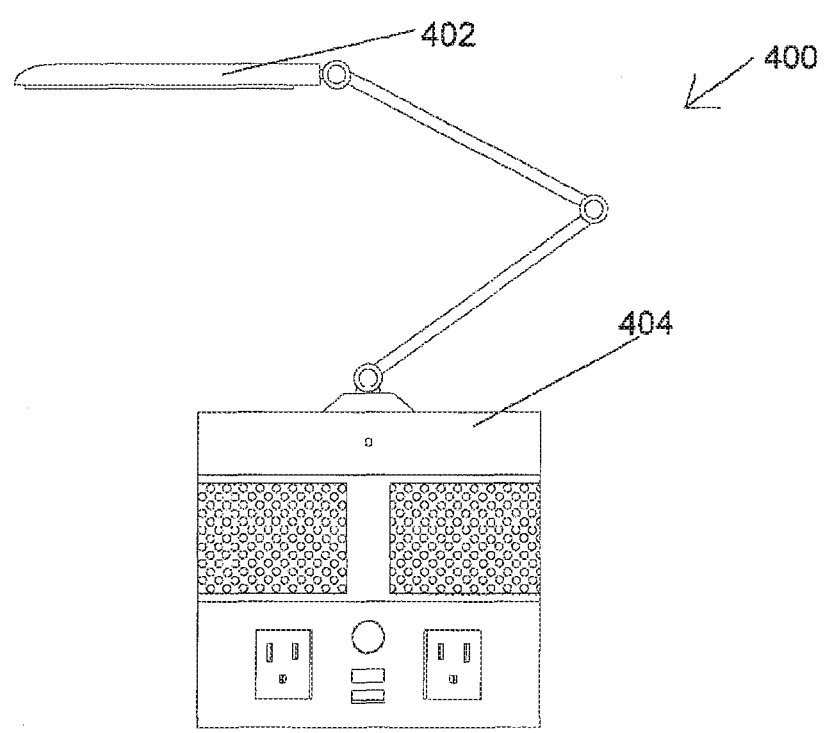
FIG. 14 is a front view of a vertical stack of modular components in accordance with the present invention.

In yet another embodiment 400, shown in FIG. 14, a lamp 402 with an interface lamp base 404 comprises a system module. Alternatively, lamp 402 could be replaced with any of a variety of desktop accessories, such as a fan, display, personal computer, pencil sharpener, cup holder, pencil holder, electric stapler, etc., either powered or passive.

Figure 15:
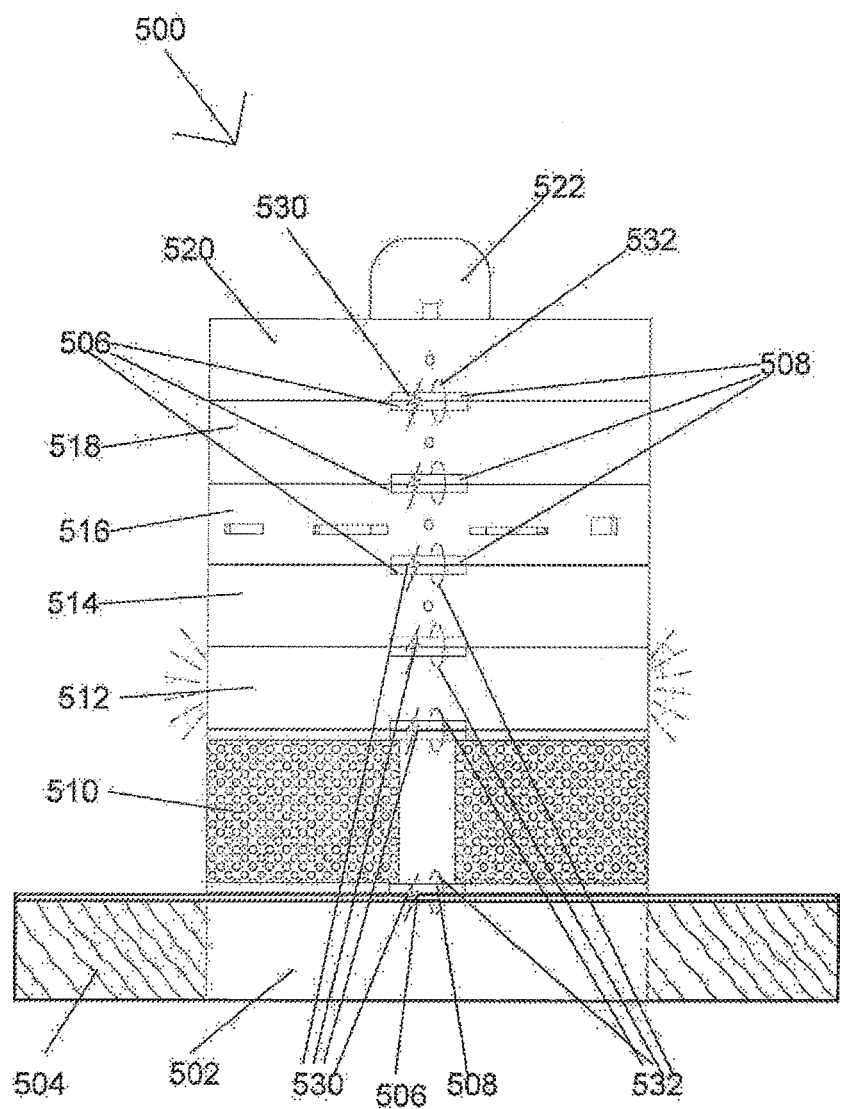
FIG. 15 is a front partial cross sectional view of stacked modules of yet another embodiment of the present invention.

Referring to FIG. 15, a further embodiment 500 of the present invention comprises a powered base hub 502 that is integrated into a support 504, which may be a table, desk, counter, or other support. Support 504 comprises a first interface coupler 506 that provides power wirelessly to the modules stacked above support 504 and powered base hub 502. Support 504 and/or powered base hub 502 may comprise an AC/DC converter, one or more charging usb ports (not shown), a power switch (not shown), and or power receptacles (not shown) for accommodating standard HV power cords to provide power to external devices not part of the invention. Speaker module 510, light module 512, solid state drive module 514, data input/output module 516, battery module 518, device dock module 520, and cradle 522 are stacked sequentially one above another. Modules 510, 512, 514, 516, and 518 could be stacked in a different order than that shown in FIGS. 15 and 16.

As shown, base 502 and each module 510, 512, 514, 516, and 518 has first interface coupler 506 at its upper surface, and each module 510, 512, 514, 516, 518, and 520 has a second interface coupler 508 at its lower surface. When stacked as shown, each first interface coupler 506 is coupled to a second interface coupler 508 of the adjacent module, allowing wireless high voltage power transmission, shown as lightning bolts 530, and wireless low voltage DC power transmission, shown as dashed circles 532, between the first and interface couplers 506 and 508.

Additional components could be used, either within an interface of components or adjacent components, such as flash drives, wireless pads/styluses; wireless mouses, wireless keyboards, wireless charging stations, web cameras, wireless receivers, wireless transmitters, battery power sources, IO panel/instrument jack, spare plug outlets (similar to a power strip), wireless headphone transmitters, auxiliary interfaced or wireless screens/displays, credit/debit card wipers, displays, personal computers, Blueray/CVD/CD/disk drives, baby monitors, air fresheners, mobile device stands, air ionizers, power interfaces UI, laptop docking stations, home controls, thermostats, fire alarm/smoke/CO detectors, gestural interfaces, numeric/calculator pads, scanners, eye tracking devices, etc. The modules may include additional type of items conveniently found on a desktop, such as lamps, mug warmers, stock tickers, electric staplers, electric pencil sharpeners, tape dispensers, pencil holders, handheld game controllers, wireless chargers, post-it note dispensers, etc.

It should be noted that in the following description terms indicating spatial orientation are used for clarity in describing the embodiments shown in the drawings and are not meant to limit the orientation of the invention. Devices in accordance with the present invention are interfaced to one another, but need not be interfaced in an upward vertical array as shown in FIGS. 3 and 7-12. For example, the base could be supported in a manner that allows interfacing downward from the powered base hub, or the array of components could be interfaced horizontally. The stack of components could rest on a desk or other horizontal work surface, rolling floor stand, ceiling hanger, or wall hanger, or they could be wall-mounted. In any case, interface connectors provide electrical continuity between adjacent modules, with wireless data communication as needed between modules. Thus, the need for multiple cables and wires is eliminated. In some embodiments, each module other than the powered base hub may have a "terminal" function, i.e., it may be the final unit in the stack of components, making the order in which the components are stacked immaterial, aside from user convenience and preference. Thus, the stack can be disassembled, and any number of desired components selected for reassembly in any order, such as if the user travels with only the selected components.

It should be further noted that although the modules are shown with a cylindrical shape, they could have any shape and any dimensions, and they need not all have the same shape or the same dimensions. Also, although the interface couplers are shown with a circular outline, they could have any shape. One or more depressions and one or more protrusions of any shape could be used to align modules used in combination with the powered base hub. Also, the interface couplers could have keyed or mateable features to insure components are aligned for connectivity. In other embodiments, the powered base hub and stackable modules could comprise embedded magnets for alignment and holding the modules securely in place.

The foregoing description is considered as illustrative only of the principles of the invention. Further, since numerous modifications and changes will readily occur to those skilled in the art, it is not desired to limit the invention to the exact construction and process shown and described above. Accordingly, all suitable modifications and equivalents may be resorted to falling within the scope of the invention.

I claim:

1. A cylindrical electronic component stack, comprising:
a disc shaped base module having an inbound alternating current (AC) power supply, at least one outbound female AC power receptor electrically connected to the AC power supply and disposed on a substantially circumferential surface of the base module, an AC/DC power converter electrically connected to the AC power supply, at least one charging port electrically connected to the AC/DC power converter and disposed on the substantially circumferential surface of the base module, a base electrical interface junction disposed on a top surface of the base module proximate a cylindrical axis, and a base mechanical coupling disposed on the top surface of the base module between the base electrical interface junction and the circumferential surface;
a first disc shaped module having a first bottom electrical interface junction disposed on a bottom surface of the first module proximate the cylindrical axis and configured for electrical connectivity with the base electrical interface junction, a first bottom mechanical coupling disposed on the bottom surface of the first module between the first bottom electrical interface junction and the circumferential surface and configured for mechanical engagement with the base mechanical coupling, and a first top electrical interface junction disposed on a top surface of the first module proximate the cylindrical axis; and a second disc shaped module having a second bottom electrical interface junction disposed on a bottom surface of the second module proximate the cylindrical axis and configured for electrical connectivity with the first top electrical interface junction, a second bottom mechanical coupling disposed on the bottom surface of the second module between the second bottom electrical interface junction and the circumferential surface and configured for mechanical engagement with the first top mechanical coupling, and a second top electrical interface junction disposed on a top surface of the second module proximate the cylindrical axis;

wherein:

the base mechanical coupling, the first bottom mechanical coupling, the first top mechanical coupling, and the second bottom mechanical coupling are configured to limit relative lateral and rotational movement among the base module, the first module, and the second module;

the base electrical interface junction is connected to the AC power supply and the AC/DC power converter;

the base electrical interface function, the first bottom electrical interface junction, the first top electrical interface junction, and the second bottom electrical interface junction are configured to simultaneously distribute high voltage AC power, low voltage DC power, and data among the base module, the first disc shaped module, and the second disc shaped module;

the base electrical interface junction and the first top electrical interface junction each comprise a disc shaped convex conductive protrusion extending above the top surface of its associated module; and the first bottom electrical interface junction and the second bottom electrical interface junction each comprise a disc shaped concave conductive recess extending into the bottom surface of its associated module, the recess being configured to receive a mating protrusion upon stacking adjacent modules together.

2. The component stack of claim 1, wherein the base electrical interface junction junctions, the first bottom electrical interface junction, the first top electrical interface junction, the second bottom electrical interface junction, and the second top electrical interface junction each comprise a high voltage channel, a low voltage channel, and a data channel.

3. The component stack of claim 1, wherein:
the base mechanical coupling and the first top mechanical coupling each comprise a self-aligning fastener configured to releasably engage the first bottom mechanical coupling and the second bottom mechanical coupling, respectively.

4. The component stack of claim 3, wherein the self-aligning fastener comprises a keyway.

5. The component stack of claim 1, wherein one of the first and second modules comprises a lamp configured to emit light radially outward along its circumferential surface.

6. The component stack of claim 1, wherein one of the first and second modules comprises a battery.

7. The component stack of claim 1, wherein:
the base module further comprises a wireless network router capable of providing WiFi communication to at least the first module; and
the first module comprises one of a facility monitor, facility controller, home appliance, audio speaker, lighting device, banking interface, social media interface, inbound DC charging port, outbound DC charging port, USB port, inbound data port, outbound data port, and business interface.

8. The component stack of claim 1, further comprising a third disc shaped module having a third bottom electrical interface junction disposed on a bottom surface of the third module proximate the cylindrical axis and configured for electrical connectivity with the second top electrical interface junction, and a third bottom mechanical coupling disposed on the bottom surface of the third module and configured for mechanical engagement with the second top mechanical coupling.

9. The component stack of claim 8, wherein:
the second top mechanical coupling and the third bottom mechanical coupling are configured to limit relative lateral and rotational movement between the second and third modules; and
the second top electrical interface junction is configured to communicate high voltage AC power, low voltage DC power, and data to the third module via the third bottom electrical interface junction.

10. A method of assembling electronic modules into an integrated stack, comprising the steps of:
providing base module having an inbound alternating current (AC) power supply, an AC/DC power converter electrically connected to the AC power supply, a base electrical interface junction disposed on a top surface of the base module, and a base mechanical coupling disposed on the top surface of the base module, the base mechanical coupling being spaced apart from the base electrical interface junction;
providing a first module having a first bottom electrical interface junction disposed on a bottom surface of the first module and configured for electrical connectivity with the base electrical interface junction, a first bottom mechanical coupling spaced apart from the first bottom electrical interface junction on the bottom surface of the first module and configured for mechanical engagement with the base mechanical coupling, and a first top electrical interface junction disposed on a top surface of the first module;
providing a second module having a second bottom electrical interface junction disposed on a bottom surface of the second module and configured for electrical connectivity with the first top electrical interface junction, and a second bottom mechanical coupling spaced apart from the second bottom electrical interface junction on the bottom surface of the second module and configured for mechanical engagement with the first top mechanical coupling;
connecting the base mechanical coupling with the first bottom mechanical coupling, and connecting the first top mechanical coupling with the second bottom mechanical coupling; and
connecting the base electrical interface junction with the first bottom electrical interface junction, and connecting the first top electrical interface junction with the second bottom electrical interface junction to thereby facilitate the simultaneous distribution of high voltage AC power, low voltage DC power, and data among the base module, the first module, and the second module; wherein:

the base electrical interface junction and the first top electrical interface junction each comprise a disc shaped convex conductive protrusion extending above the top surface of its associated module; and the first bottom electrical interface junction and the second bottom electrical interface junction each comprise a disc shaped concave conductive recess extending into the bottom surface of its associated module, the recess being configured to receive a mating protrusion upon stacking adjacent modules together.

11. The method of claim 10, wherein connecting adjacent electrical interface junctions comprises manual alignment facilitated by substantially self-aligning electrical interface junctions.

12. The method of claim 11, wherein:

adjacent electrical interface junctions comprise an electrically conductive protrusion and a corresponding electrically conductive depression; and manually aligning adjacent electrical interface junctions comprises guiding a protrusion into a mating depression.

13. The method of claim 10, wherein connecting adjacent mechanical couplings comprises manual alignment guided by substantially self-aligning releasable fasteners.

14. The method of claim 13, wherein:

adjacent mechanical couplings comprise at least one of a magnet, a keyed mechanical fastener, or a combination of both; and manually aligning adjacent mechanical couplings comprises guiding adjacent mechanical couplings into mutual registration.

15. The method of claim 10, wherein the electrical interface junctions each comprise respective electrically isolated high voltage AC power, low voltage DC power, and data channels.

16. The method of claim 10, wherein:

the base module further comprises a wireless network router;

one of the first and second modules comprises a lamp configured for circumferential light emission; and one of the first and second modules comprises a battery.

17. The method of claim 10, further comprising:

providing a third module having a third bottom electrical interface junction disposed on a bottom surface of the third module and configured for electrical connectivity with a second top electrical interface junction disposed on a top surface of the second module, a third bottom mechanical coupling spaced apart from the third bottom electrical interface junction on the bottom surface of the third module and configured for mechanical engagement with a second top mechanical coupling junction spaced apart from the second top electrical interface junction on the top surface of the second module.

* * * * *